United States Patent
Omi et al.

(10) Patent No.: US 6,549,552 B1
(45) Date of Patent: *Apr. 15, 2003

(54) NITRIDE-TYPE COMPOUND SEMICONDUCTOR LASER DEVICE AND LASER APPARATUS INCORPORATING THE SAME

(75) Inventors: Susumu Omi, Tenri (JP); Toshiyuki Okumura, Tenri (JP); Kazuhiko Inoguchi, Nara (JP)

(73) Assignee: Sharp Kabushiki Kaisha (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/143,608

(22) Filed: Aug. 31, 1998

(30) Foreign Application Priority Data

Sep. 3, 1997 (JP) ............................................. 9-237925

(51) Int. Cl.⁷ ................................................ H01S 5/00
(52) U.S. Cl. ........................................... 372/45; 372/46
(58) Field of Search ............................. 372/45, 46, 50; 257/13

(56) References Cited

U.S. PATENT DOCUMENTS

| | | | | |
|---|---|---|---|---|
| 4,359,774 A | * | 11/1982 | Olsen et al. | 372/45 |
| 5,056,100 A | * | 10/1991 | Vahala et al. | 372/50 |
| 5,495,493 A | * | 2/1996 | Kurihara et al. | 372/46 |
| 5,557,627 A | * | 9/1996 | Schneider, Jr. et al. | 372/46 |
| 5,563,422 A | * | 10/1996 | Nakamura et al. | 257/13 |
| 5,974,069 A | * | 10/1999 | Tanaka et al. | 372/46 |

FOREIGN PATENT DOCUMENTS

| | | |
|---|---|---|
| JP | 07249820 A | 3/1994 |
| JP | 6-314822 | 11/1994 |
| JP | 6-338632 | 12/1994 |
| JP | 7-235729 | 9/1995 |
| JP | 08-097502 | * 4/1996 |

* cited by examiner

*Primary Examiner*—Quyen Leung
(74) *Attorney, Agent, or Firm*—Morrison & Foerster LLP

(57) ABSTRACT

A nitride-type compound semiconductor laser device includes a substrate and a layered structure provided on the substrate. A light absorption layer having a bandgap smaller than a bandgap of an active layer in the layered structure is provided in a position between the cladding layer, which is provided on a side opposite to a mount surface with respect to the active layer, and a surface of the layered structure which is opposite to the mount surface.

4 Claims, 8 Drawing Sheets

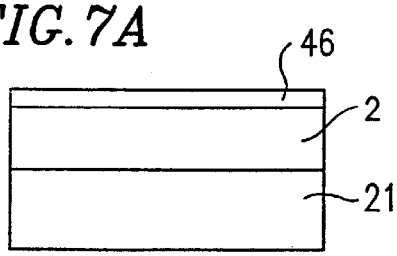
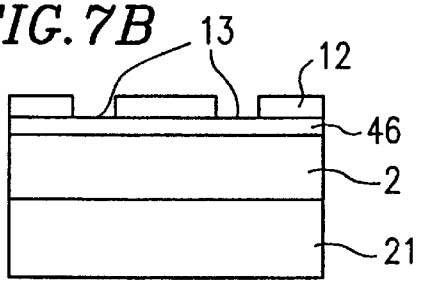
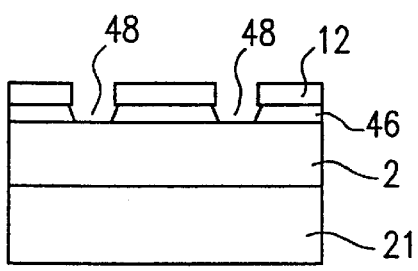
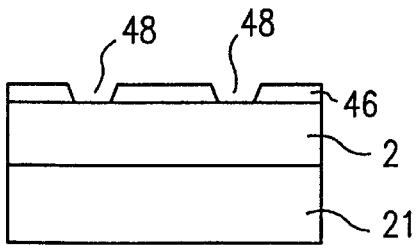
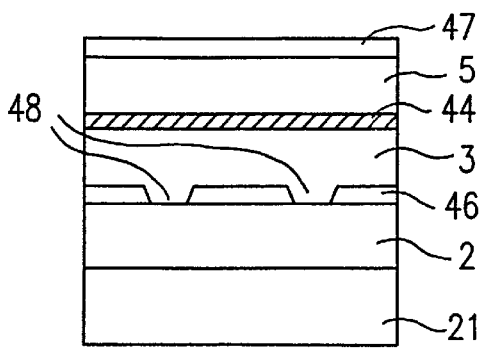
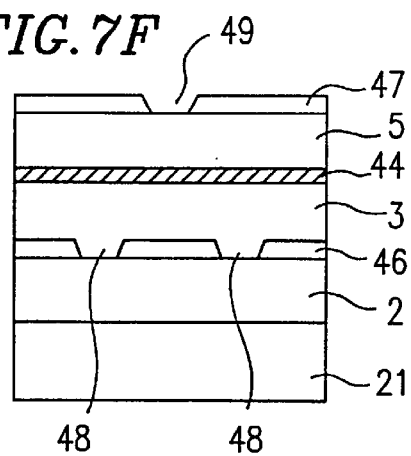
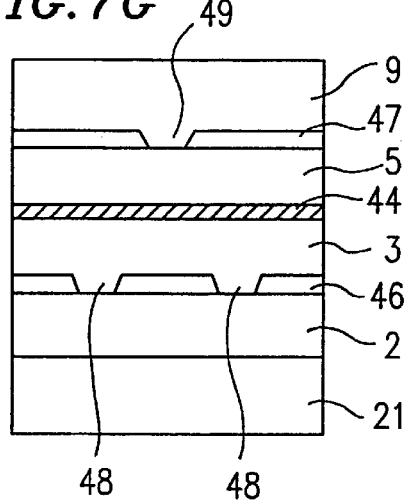
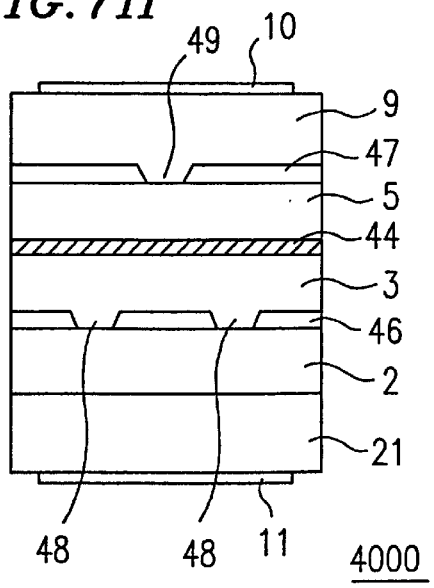

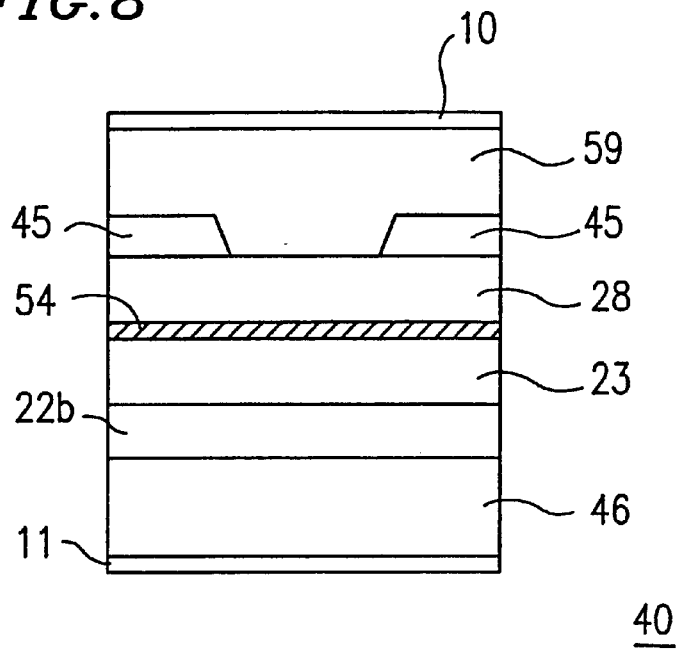
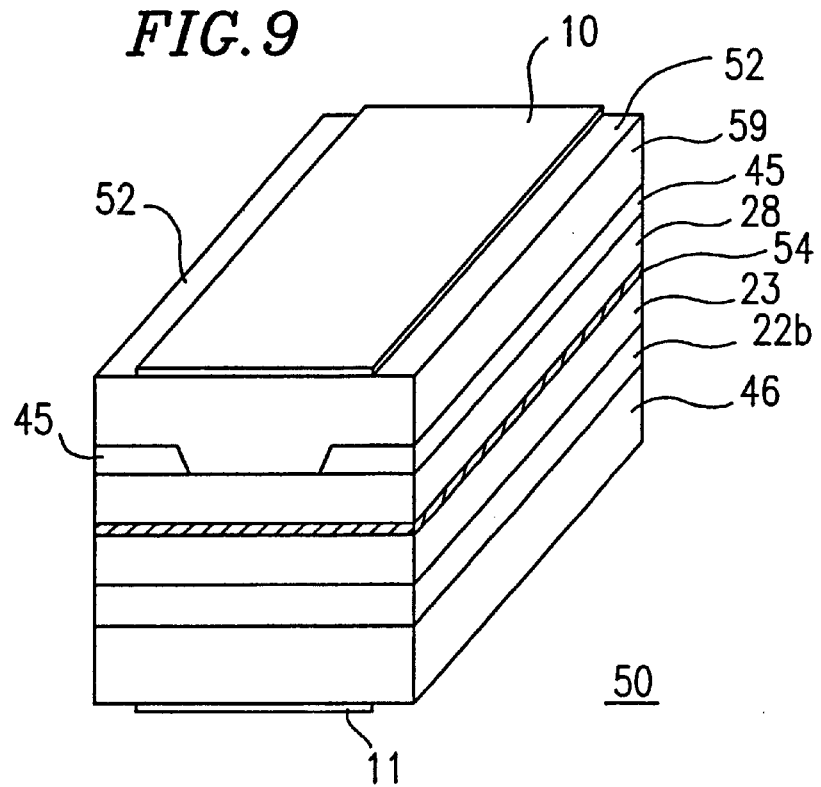

FIG.11A
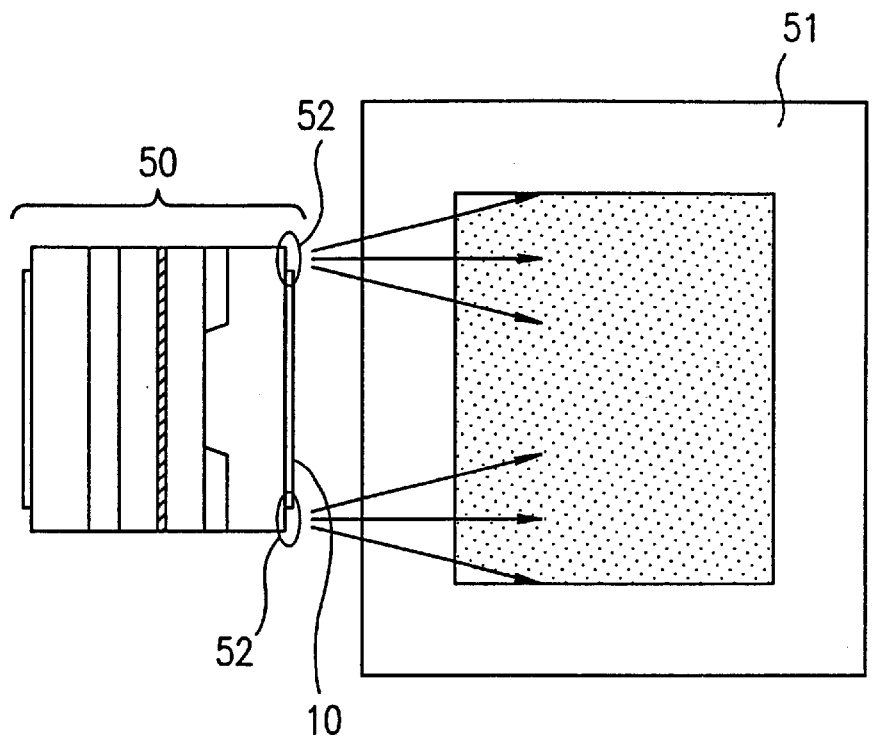
FIG.11B
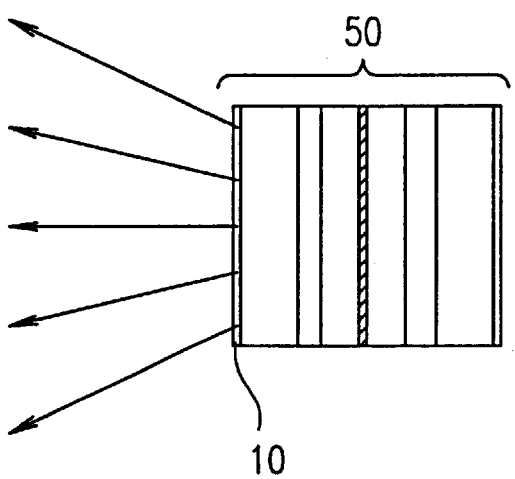
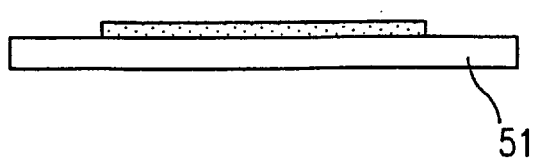

NITRIDE-TYPE COMPOUND SEMICONDUCTOR LASER DEVICE AND LASER APPARATUS INCORPORATING THE SAME

BACKGROUND OF THE INVENTION

1. Field of the Invention

The present invention relates to a nitride-type compound semiconductor laser device capable of emitting light from a blue range to a UV range, and further relates to a laser apparatus incorporating the same.

2. Description of the Related Art

Gallium nitride is a III-V group compound semiconductor material whose bandgap is as large as about 3.4 eV, and has been positively studied as a material to be used in a light emitting device capable of emitting light from a blue range to a UV range.

Referring to FIG. 8, a conventional gallium nitride-type compound semiconductor laser 40 will be described.

The semiconductor laser 40 of FIG. 8 includes a layered structure in which an n-type GaN buffer layer 22b, an n-type AlGaN cladding layer 23, an As-added GaN light emitting layer 54, a p-type AlGaN cladding layer 28 and a p-type GaN contact layer 59 are formed in this order on a 3C-SiC substrate 46. An n-type GaN current blocking layer 45 including a stripe-shaped opening is formed on the p-type AlGaN cladding layer 28. A p-electrode 10 and an n-electrode 11 are provided on the upper surface of the p-type GaN contact layer 59 and on the bottom surface of the 3C-SiC substrate 46, respectively. A current flowing from the p-electrode 10 to the n-electrode 11 is constricted by the n-type GaN current blocking layer 45. Such a gallium nitride-type compound semiconductor laser is disclosed in, for example, Japanese Laid-open Publication No. 7-249820.

However, it is not practical to form electrodes over the entire upper and bottom surfaces of the device, as in such a conventional gallium nitride-type compound semiconductor laser 40 illustrated in FIG. 8. Thus, in many cases, there are provided areas 52 along sides of the device which are not covered by the electrodes, as shown in FIG. 9.

FIG. 10 is a perspective view illustrating the conventional gallium nitride-type compound semiconductor laser 50 of FIG. 9 having the areas 52, as it is incorporated into a package. In FIG. 10, reference numeral 51 denotes a photodiode and reference numeral 53 denotes a back surface of the semiconductor laser device 50 which corresponds to the surface on which the electrode 10 is formed in FIG. 9. FIGS. 11A and 11B are schematic diagrams each illustrating the positional relationship between the conventional gallium nitride-type compound semiconductor laser 50 and the photodiode 51 incorporated in the same package illustrated in FIG. 10. Specifically, in FIGS. 11A and 11B, the photodiode 51 is viewed from directions indicated by arrows A and B in FIG. 10, respectively.

In many cases, the photodiode 51 is provided on the side of the back surface 53 of the semiconductor laser 50, as illustrated in FIG. 10, for detecting the output from the back of the semiconductor laser 50 and for controlling the semiconductor laser 50 based on the detected output. A layered structure constituting such a conventional gallium nitride-type compound semiconductor laser is transparent to the emission wavelength. Therefore, as illustrated in FIGS. 11A and 11B, the light generated in the active layer may partially leak out of the device through the areas 52 which are not covered by the electrode 10 and be incident upon the photodiode 51 as noise, thereby causing an erroneous control.

Moreover, since such a package typically includes a cap welded thereto for airtight sealing, the leaked light impinges on the inner wall of the cap and causes multiple reflection. Thus, even when the photodiode 51 is provided at a position other than on the side of the back surface 53 of the semiconductor laser 50 as illustrated in FIG. 10, such leaked light may still be incident upon the photodiode 51 as noise, thereby causing an erroneous control.

SUMMARY OF THE INVENTION

A nitride-type compound semiconductor laser device of the present invention includes a substrate and a layered structure provided on the substrate. A light absorption layer having a bandgap smaller than a bandgap of an active layer in the layered structure is provided in a position between the cladding layer, which is provided on a side opposite to a mount surface with respect to the active layer, and a surface of the layered structure which is opposite to the mount surface.

The light absorption layer may include a stripe-shaped opening; and an opaque electrode may be provided on the surface of the layered structure which is opposite to the mount surface so as to completely block a light path which is travelling from a light emitting section through the stripe-shaped opening to the surface of the layered structure which is opposite to the mount surface.

The laser device may further include another light absorption layer having a bandgap smaller than the bandgap of the active layer, which is provided on the same side as the mount surface with respect to the active layer.

The light absorption layer may be formed of $Ga_sAl_tIn_{1-s-t}N$ ($0<s<1$, $0\leq t<1$ and $0<s+t<1$).

A laser apparatus of the present invention includes a nitride-type compound semiconductor laser device as set forth above and a light receiving device provided in a same package.

In the nitride-type compound semiconductor laser device of the present invention, when a voltage is applied across the electrodes, a current flows through the semiconductor layered structure from the p-electrode to the n-electrode, thereby generating light in the active layer. The generated light partially seeps into the cladding layer. However, since the light absorption layer which has a bandgap smaller than that of the active layer is provided on the side opposite to the mount surface for a sub-mount or the like with respect to the active layer, the light seeping into the cladding layer is either absorbed by the light absorption layer, or blocked by the upper electrode after passing through the opening of the light absorption layer which provides a current path. Therefore, even if a photodiode is provided in the same package with this gallium nitride-type compound semiconductor laser, such light is never incident upon the photodiode as noise to cause an erroneous control.

More preferably, another light absorption layer which also has a bandgap smaller than that of the active layer may be provided on the same side as the mount surface for a sub-mount or the like with respect to the active layer. In such a case, even when the substrate material is transparent to the emission wavelength, the light seeping into the cladding layer is never reflected by the mount surface, and thus noise is not generated.

Still more preferably, the light absorption layer may have a conductivity type opposite to that of the layers provided on the same side as the light absorption layer with respect to the active layer, while a stripe-shaped opening may be provided in the light absorption layer by removing a portion thereof. In such a case, the light absorption layer can exhibit a current blocking function.

Thus, the invention described herein makes possible the advantages of: (1) providing a nitride-type compound semiconductor laser device without light leakage which may cause an erroneous control of a photodiode to be provided in the same package with the nitride-type compound semiconductor laser device; (2) providing a laser apparatus in which the aforementioned nitride-type compound semiconductor laser device and a light receiving device are provided in the same package; and (3) providing a circuit for photoelectrically converting an output of the above nitride-type compound semiconductor laser device by the light receiving device and for controlling a current to be input to the nitride-type compound semiconductor laser device based on the photoelectrically converted output.

These and other advantages of the present invention will become apparent to those skilled in the art upon reading and understanding the following detailed description with reference to the accompanying figures.

BRIEF DESCRIPTION OF THE DRAWINGS

FIGS. 7A to 7H are cross-sectional views illustrating a method for producing the nitride-type compound semiconductor light emitting device of FIG. 4;

FIG. 8 is a cross-sectional view schematically illustrating a structure of a conventional nitride-type compound semiconductor laser;

FIG. 9 is a view schematically illustrating another conventional nitride-type compound semiconductor laser;

FIGS. 11A and 11B are schematic diagrams each illustrating the positional relationship between the conventional nitride-type compound semiconductor laser device and a photodiode incorporated in the same package as shown in FIG. 10, wherein the photodiode is viewed from above and from its side, respectively.

DESCRIPTION OF THE PREFERRED EMBODIMENTS

In this specification, the term "gallium nitride-type compound semiconductor" includes those in which Ga of gallium nitride (GaN) is partially substituted with another III group element,. e.g., $Ga_xAl_yIn_{1-s-t}N$ ($0<s\leq 1$, $0\leq t<1$ and $0<s+t\leq 1$), those in which some of the constituent atoms are substituted with impurity atoms or the like, and those to which an impurity is added.

Hereinafter, the present invention will be described by way of illustrative examples with reference to the accompanying figures.

EXAMPLE 1

Figure 1:
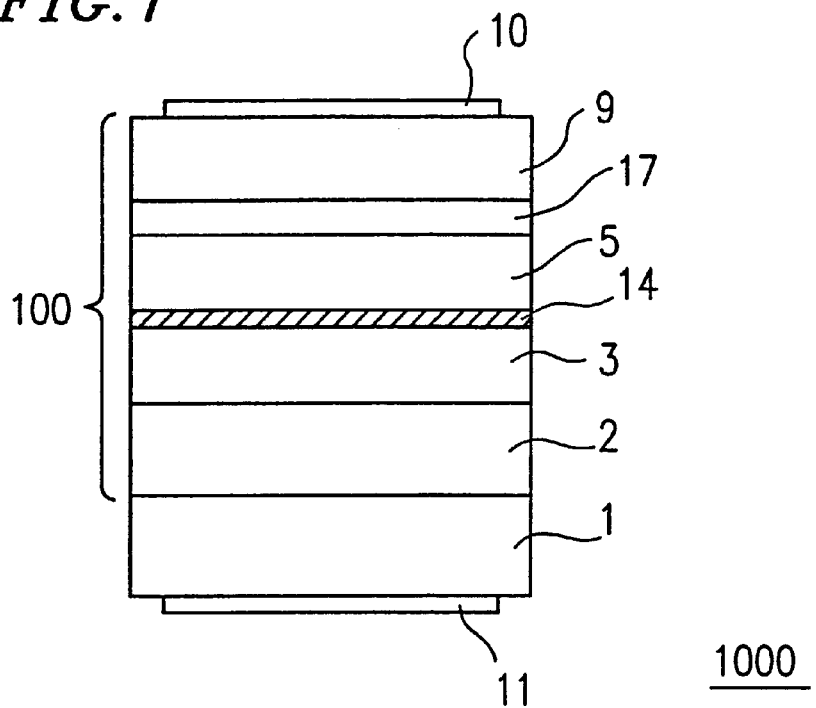
FIG. 1 is a cross-sectional view schematically illustrating a structure of a nitride-type compound semiconductor light emitting device according to Example 1 of the present example.

Referring to FIG. 1, a gallium nitride-type compound semiconductor laser device 1000 according to Example 1 of the present invention will be described. FIG. 1 is a cross-sectional view schematically illustrating a structure of the semiconductor laser device 1000 of the present example.

As illustrated in FIG. 1, the semiconductor laser device 1000 includes a low-resistance n-type 6H-SiC substrate 1, a semiconductor layered structure 100 provided on the substrate 1, and a pair of electrodes 10 and 11 for supplying a current (driving current) required for light emission. The mount surface of the semiconductor laser device 1000 is on the side of the electrode 11.

Hereinafter, the structure of the semiconductor layered structure 100 will be described in detail.

The semiconductor layered structure 100 includes, in the following order on the low-resistance n-type 6H-SiC substrate 1, an n-type GaN buffer layer 2 (thickness: about 0.6 $\mu$m), an n-type $Al_{0.1}Ga_{0.9}N$ cladding layer 3 (thickness: about 0.7 $\mu$m), a non-doped $In_{0.32}Ga_{0.68}N$ active layer 14 (thickness: about 40 Å), an Mg-doped $Al_{0.1}Ga_{0.9}N$ cladding layer 5 (thickness: about 0.7 $\mu$m), a p-type $In_{0.36}Ga_{0.64}N$ light absorption layer 17 (thickness: about 0.2 $\mu$m), and a p-type GaN contact layer 9 (thickness: about 0.5 $\mu$m).

The p-electrode 10 is provided on the upper surface of the p-type GaN contact layer 9, and the n-electrode 11 is provided on the bottom surface of the substrate 1. When a voltage is applied from a current supply circuit (not shown) across the electrodes 10 and 11, the current flows through the semiconductor layered structure 100 from the p-electrode 10 to the n-electrode 11. While light is generated in the active layer 14, the generated light partially seeps into the cladding layer. However, since the p-type $In_{0.36}Ga_{0.64}N$ light absorption layer 17 has a bandgap smaller than that of the active layer 14 and is provided on the other side of the p-type $Al_{0.1}Ga_{0.9}N$ cladding layer 5 from the non-doped $In_{0.32}Ga_{0.68}N$ active layer 14, the light seeping into the p-type $Al_{0.1}Ga_{0.9}N$ cladding layer 5 is absorbed by the p-type $In_{0.36}Ga_{0.64}N$ light absorption layer 17. Therefore, even if a photodiode is provided in the same package with this gallium nitride-type compound semiconductor laser 1000, such light is never incident upon the photodiode as a noise to cause an erroneous control.

Hereinafter, a method for producing the semiconductor laser device 1000 of FIG. 1 will be described.

In the present example, a metal-organic chemical vapor deposition (MOCVD) method is used to form the gallium nitride-type semiconductor layers. In particular, ammonia ($NH_3$) is used as a V group material source, and trimethylgallium (TMG), trimethylaluminum (TMA) or trimethylindium (TMI) is used as a III group material source. Moreover, $H_2$ or $N_2$, for example, may be used as a carrier gas. Biscyclopentadienyl magnesium ($Cp_2Mg$) is used as a p-type impurity, and monosilane ($SiH_4$) is used as an n-type impurity.

For crystal growth using the aforementioned MOCVD method, the low-resistance n-type 6H-SiC substrate 1 is placed on a susceptor in an MOCVD apparatus (not shown), and the substrate 1 is heated to about 1200° C., thereby cleaning the surface of the substrate 1.

Then, after the n-type 6H-SiC substrate 1 is cooled down to about 1000° C., the n-type GaN buffer layer 2 and the n-type $Al_{0.1}Ga_{0.9}N$ cladding layer 3 are grown on the n-type 6H-SiC substrate 1. Thereafter, the substrate 1 is further cooled down to between about 800° C. to about 850° C., and the non-doped $In_{0.32}Ga_{0.68}N$ active layer 14 is grown. Then, the substrate 1 is heated again to about 1000° C., and the Mg-doped $Al_{0.1}Ga_{0.9}N$ cladding layer 5 is grown. Thereafter, the substrate 1 is again cooled down to between about 800° C. to about 850° C., and the Mg-doped $In_{0.36}Ga_{0.64}N$ light absorption layer 17 is grown. Then, the substrate 1 is again heated to about 1000° C., and the Mg-doped GaN contact layer 9 is grown.

The substrate 1 is taken out of the MOCVD apparatus and is subjected to a thermal annealing process in an $N_2$ atmosphere at about 800° C. so as to change the Mg-doped layers into p-type layers. Then, the p-electrode 10 is formed on the p-type GaN contact layer 9, and the n-electrode 11 is formed on the bottom surface of the low-resistance n-type 6H-SiC substrate 1.

Although the thickness of the n-type GaN buffer layer 2 is about 0.6 $\mu$m in the present example, it can also take any other value in the range of about 0.5 $\mu$m to about 4 $\mu$m. When the buffer layer 2 is thinner than about 0.5 $\mu$m, it is likely that crystal defects of the substrate 1 will be transferred to the layered structure on this n-type GaN buffer layer 2. On the other hand, when the buffer layer 2 is thicker than about 4 $\mu$m, a resistance component of this n-type GaN buffer layer 2 itself may increase to a non-negligible level.

Moreover, although the thickness of each of the cladding layers (the n-type $Al_{0.1}Ga_{0.9}N$ cladding layer 3 and the Mg-doped $Al_{0.1}Ga_{0.9}N$ cladding layer 5) is about 0.7 $\mu$m in the present example, it can also take any other value in the range of about 0.7 $\mu$m to about 1 $\mu$m. When the cladding layers 3 and 5 are thinner than about 0.7 $\mu$m, the light generated in the active layer 14 may not be confined sufficiently. On the other hand, when the cladding layers 3 and 5 are thicker than about 1 $\mu$m, it is very likely that a crack will occur in the $Al_{0.1}Ga_{0.9}N$ cladding layers 3 and 5.

Furthermore, although the thickness of the non-doped $In_{0.32}Ga_{0.68}N$ active layer 14 is about 40 Å in the present example, it can also take any other value in the range of about 30 Å to about 800 Å. When the active layer 14 is thinner than about 30 Å, light confinement may not be sufficient. On the other hand, when the active layer 14 is thicker than about 800 Å, a threshold current density may increase.

Furthermore, although the thickness of the p-type $In_{0.36}Ga_{0.64}N$ light absorption layer 17 is about 0.2 $\mu$m in the present example, it can also take any other value in the range of about 0.05 $\mu$m to about 0.5 $\mu$m. When the light absorption layer 17 is thinner than about 0.05 $\mu$m, the light absorption effect may not be sufficient. On the other hand, when the light absorption layer 17 is thicker than about 0.5 $\mu$m, the injection efficiency of the holes into the active layer 14 may be lowered to an unacceptable level.

Futhermore, although the thickness of the p-type GaN contact layer 9 is about 0.5 $\mu$m in the present example, it can also take any other value in the range of about 0.1 $\mu$m to about 1 $\mu$m. When the contact layer 9 is thinner than about 0.1 $\mu$m, a contact resistance between the contact layer 9 and the p-electrode 10 may not be reduced sufficiently. On the other hand, when the contact layer 9 is thicker than about 1 $\mu$m, a resistance component of this p-type GaN contact layer 9 itself may increase to a non-negligible level.

EXAMPLE 2

In Example 1 as set forth above, due to the presence of the light absorption layer 17 which has a bandgap smaller than that of the active layer 14, the injection efficiency of the carriers into the active layer 14 may possibly be lowered depending upon the composition or the thickness of the light absorption layer 17. This can be avoided by employing a structure in which an opening is provided in the light absorption layer such that light leaked through the opening can be blocked by the electrode design. Hereinafter, this will be described as Example 2 of the present invention.

Figure 2:
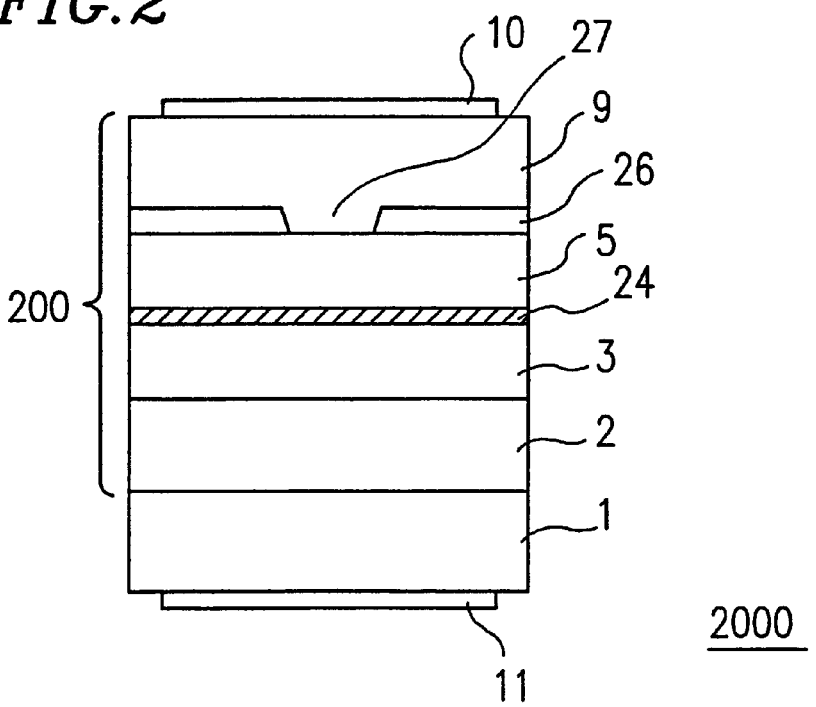
FIG. 2 is a cross-sectional view schematically illustrating a structure of a nitride-type compound semiconductor light emitting device according to Example 2 of the present example.

Referring to FIG. 2, a gallium nitride-type compound semiconductor laser device 2000 according to Example 2 of the present invention will be described. FIG. 2 is a cross-sectional view schematically illustrating a structure of the semiconductor laser device 2000 of the present example.

As illustrated in FIG. 2, the semiconductor laser device 2000 includes a low-resistance n-type 6H-SiC substrate 1, a semiconductor layered structure 200 provided on the substrate 1, and a pair of electrodes 10 and 11 for supplying a current (driving current) required for light emission. The mount surface of the semiconductor laser device 2000 is on the side of the electrode 11.

Hereinafter, the structure of the semiconductor layered structure 200 will be described in detail.

The semiconductor layered structure 200 includes, in the following order on the low-resistance n-type 6H-SiC substrate 1, the n-type GaN buffer layer 2 (thickness: about 0.7 $\mu$m), the n-type $Al_{0.1}Ga_{0.9}N$ cladding layer 3 (thickness: about 0.8 $\mu$m), a non-doped $In_{0.3}Ga_{0.69}N$ active layer 24 (thickness: about 50 Å), the p-type $Al_{0.1}Ga_{0.9}N$ cladding layer 5 (thickness: about 0.8 $\mu$m), an n-type $In_{0.35}Ga_{0.65}N$ light absorption layer 26 (thickness: about 0.1 $\mu$m), and the p-type GaN contact layer 9 (thickness: about 0.8 $\mu$m). The n-type $In_{0.35}Ga_{0.65}N$ light absorption layer 26 includes a stripe-shaped opening 27 extending along the cavity length direction.

The p-electrode 10 is provided on the upper surface of the Mg-doped GaN contact layer 9, and the n-electrode 11 is provided on the bottom surface of the substrate 1. The p-electrode 10 is an opaque electrode and is located so as to completely block a light path which is travelling thereto from the light emitting section through the stripe-shaped opening 27 and the p-type GaN contact layer 9.

When a voltage is applied from a current supply circuit (not shown) across the electrodes 10 and 11, the current flows through the semiconductor layered structure 200 from the p-electrode 10 to the n-electrode 11. The n-type $In_{0.35}Ga_{0.65}N$ light absorption layer 26 sandwiched between the p-type $Al_{0.1}Ga_{0.9}N$ cladding layer 5 and the p-type GaN contact layer 9 has the opposite conductivity type to that of the p-type $Al_{0.1}Ga_{0.9}N$ cladding layer 5 and the p-type GaN contact layer 9, and thus, considerably inhibits the injection of the holes into the active layer 24. However, when the stripe-shaped opening 27 is provided in the n-type $In_{0.35}Ga_{0.65}N$ light absorption layer 26, as in the present example, the holes are selectively injected into the active layer 24 through the opening 27, whereby light is generated in a portion of the active layer 24 directly under the opening 27.

The generated light partially seeps into the cladding layers 3 and 5. However, since the n-type $In_{0.35}Ga_{0.65}N$ light absorption layer 26 has a bandgap smaller than that of the active layer 24 and is provided on the other side of the p-type $Al_{0.1}Ga_{0.9}N$ cladding layer 5 from the non-doped $In_{0.30}Ga_{0.69}N$ active layer 24, the light seeping into the Mg-doped $Al_{0.1}Ga_{0.9}N$ cladding layer 5 is either absorbed by the n-type $In_{0.35}Ga_{0.65}N$ light absorption layer 26, or blocked by the p-electrode 10 after passing through the opening 27 of the n-type $In_{0.35}Ga_{0.65}N$ light absorption layer 26 which provides a current path. Therefore, in either case, even if a photodiode is provided in the same package with this gallium nitride-type compound semiconductor laser 2000, such light is never incident upon the photodiode as noise to cause an erroneous control.

Moreover, because of the conductivity type of the n-type $In_{0.35}Ga_{0.65}N$ light absorption layer 26 being opposite to that of the p-type $Al_{0.1}Ga_{0.9}N$ cladding layer 5 and the p-type GaN contact layer 9, the present example provides other advantages such that it is possible to reduce a threshold current and to control transverse modes.

Hereinafter, referring to FIGS. 5A to 5F, a method for producing the semiconductor laser device 2000 of FIG. 2 will be described.

For performing the first crystal growth using the same MOCVD method as in Example 1, the low-resistance n-type 6H-SiC substrate 1 is placed on a susceptor in an MOCVD apparatus (not shown), and the substrate 1 is heated to about 1200° C., thereby cleaning the surface of the substrate 1.

Figure 5A:
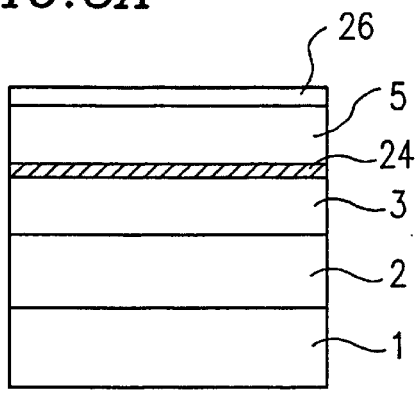
FIGS. 5A to 5F are cross-sectional views illustrating a method for producing the nitride-type compound semiconductor light emitting device of FIG. 2.

Then, after the n-type 6H-SiC substrate 1 is cooled down to about 1000° C., the n-type GaN buffer layer 2 and the n-type $Al_{0.1}Ga_{0.9}N$ cladding layer 3 are grown on the n-type 6H-SiC substrate 1. Thereafter, the substrate 1 is further cooled down to between about 800° C. to about 850° C., and the non-doped $In_{0.31}Ga_{0.69}N$ active layer 24 is grown. Then, the substrate 1 is heated again to about 1000° C., and the Mg-doped $Al_{0.1}Ga_{0.9}N$ cladding layer 5 is grown. Thereafter, the substrate 1 is again cooled down to between about 800° C. to about 850° C., and the n-type $In_{0.35}Ga_{0.65}N$ light absorption layer 26 is grown. Thus, the structure as illustrated in FIG. 5A is obtained.

Figure 5D:
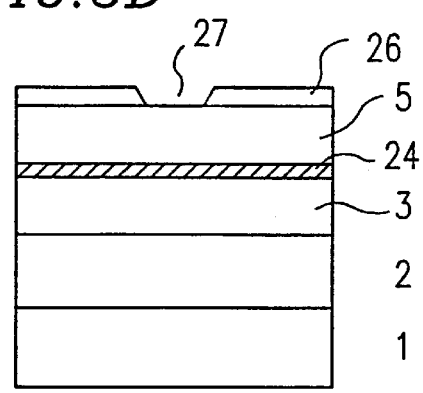
Figure 5B:
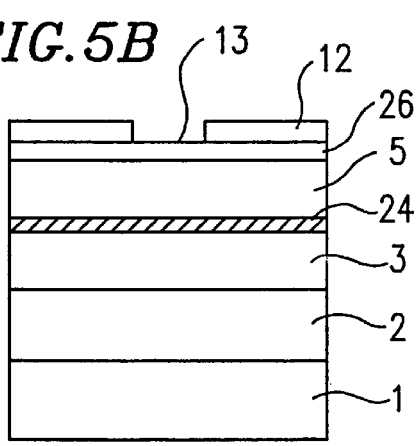

The substrate 1, on which the above-described semiconductor layers are formed, is once taken out of the growth chamber, and a mask 12 as illustrated in FIG. 5B is formed on the n-type $In_{0.35}Ga_{0.65}N$ light absorption layer 26 by using an ordinary photolithography technique. The mask 12 may be formed from a resist, or from $SiO_x$, $SiN_x$ (where x is an integer of about 1 or 2) or Ni. The mask 12 includes a stripe-shaped opening 13.

Figure 5E:
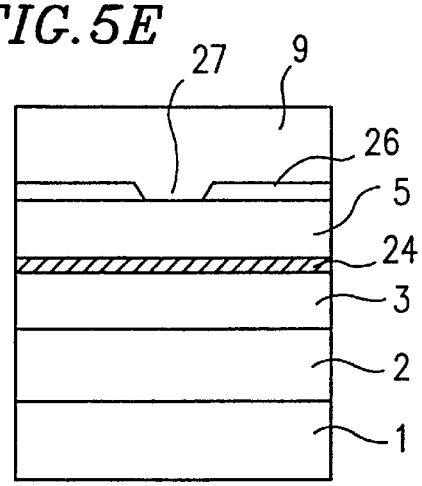
Figure 5C:
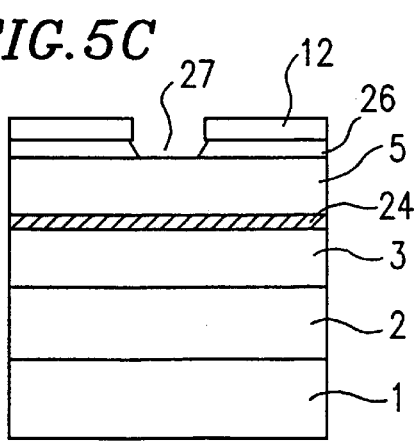

Then, a portion of the n-type $In_{0.35}Ga_{0.65}N$ light absorption layer 26 which is not covered by the mask 12 is selectively etched away by using a dry etching technique, as illustrated in FIG. 5C. The etching process is stopped at a time when the surface of the Mg-doped $Al_{0.1}Ga_{0.9}N$ cladding layer 5 is exposed. The etching process can be performed by, for example, RIE using a gas such as a $Cl_2$ gas. Thereafter, the mask 12 is removed by using an appropriate etchant (e.g., an organic solvent when the mask 12 is a photoresist) as illustrated in FIG. 5D.

Then, for performing the second crystal growth (regrowth), the substrate 1 is again placed on the susceptor in the MOCVD apparatus. After the substrate 1 is heated to about 1000° C., the Mg-doped GaN contact layer 9 is grown, as illustrated in FIG. 5E.

Figure 5F:
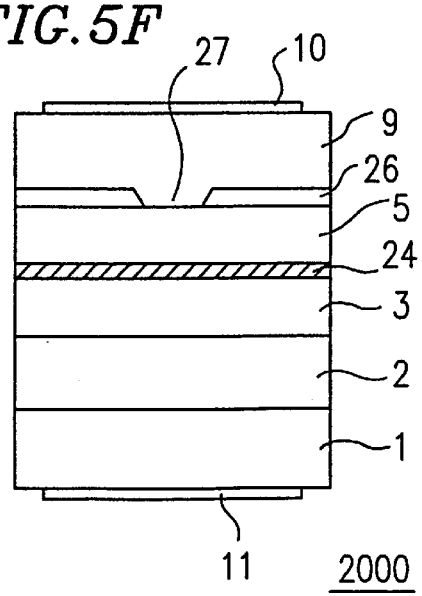

The substrate 1 is again taken out of the MOCVD apparatus and is subjected to a thermal annealing process in an $N_2$ atmosphere at about 800° C. so as to change the Mg-doped layers into p-type layers. Then, the p-electrode 10 is formed on the p-type GaN contact layer 9, and the n-electrode 11 is formed on the bottom surface of the low-resistance n-type 6H-SiC substrate 1, as illustrated in FIG. 5F.

Although the thickness of the n-type GaN buffer layer 2 is about 0.7 µm in the present example, it can also take any other value in the range of about 0.5 µm to about 4 µm. When the buffer layer 2 is thinner than about 0.5 µm, it is likely that crystal defects of the substrate 1 will be transferred to the layered structure on this n-type GaN buffer layer 2. On the other hand, when the buffer layer 2 is thicker than about 4 µm, a resistance component of this n-type GaN buffer layer 2 itself may increase to a non-negligible level.

Moreover, although the thickness of each of the cladding layers (the n-type $Al_{0.1}Ga_{0.9}N$ cladding layer 3 and the Mg-doped $Al_{0.1}Ga_{0.9}N$ cladding layer 5) is about 0.8 µm in the present example, it can also take any other value in the range of about 0.7 µm to about 1 µm. When the cladding layers 3 and 5 are thinner than about 0.7 µm, the light generated in the active layer 24 may not be confined sufficiently. On the other hand, when the cladding layers 3 and 5 are thicker than about 1 µm, it is very likely that a crack will occur in the $Al_{0.1}Ga_{0.9}N$ cladding layers 3 and 5.

Futhermore, although the thickness of the non-doped $In_{0.31}Ga_{0.69}N$ active layer 24 is about 50 Å in the present example, it can also take any other value in the range of about 30 Å to about 800 Å. When the active layer 24 is thinner than about 30 Å, light confinement may not be sufficient. On the other hand, when the active layer 24 is thicker than about 800 Å, a threshold current density may increase.

Furthermore, although the thickness of the n-type $In_{0.35}Ga_{0.65}N$ light absorption layer 26 is about 0.1 µm in the present example, it can also take any other value in the range of about 0.05 µm to about 0.5 µm. When the light absorption layer 26 is thinner than about 0.05 µm, the light absorption effect may not be sufficient. On the other hand, when the light absorption layer 26 is thicker than about 0.5 µm, the injection efficiency of the holes into the active layer 24 may be lowered to an unacceptable level.

Furthermore, although the thickness of the p-type GaN contact layer 9 is about 0.8 µm in the present example, it can also take any other value in the range of about 0.1 µm to about 1 µm. When the contact layer 9 is thinner than about 0.1 µm, a contact resistance between the contact layer 9 and the p-electrode 10 may not be reduced sufficiently. On the other hand, when the contact layer 9 is thicker than about 1 µm, a resistance component of this p-type GaN contact layer 9 itself may increase to a non-negligible level.

It should be noted that, in Examples 1 and 2 above, the light absorption layer 17 or 26 is provided on the other side of the active layer 14 or 24 from the mount surface for a sub-mount or the like. In such a structure, when the selected substrate is transparent to the emission wavelength, for example, it is possible that the light leaked toward the mount surface is reflected by the mount surface and leaks out of the device. Such a problem can similarly be solved by providing another light absorption layer in the device on the side of the mount surface. Hereinafter, this will be described as Examples 3 and 4 of the present invention.

EXAMPLE 3

Figure 3:
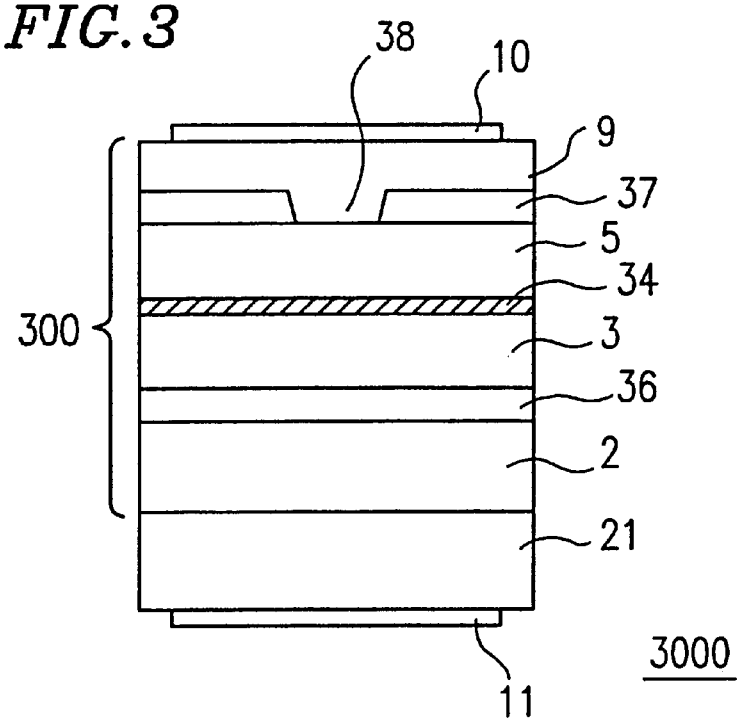
FIG. 3 is a cross-sectional view schematically illustrating a structure of a nitride-type compound semiconductor light emitting device according to Example 3 of the present example.

Referring to FIG. 3, a gallium nitride-type compound semiconductor laser device 3000 according to Example 3 of the present invention will be described.

As illustrated in FIG. 3, the semiconductor laser device 3000 of the present example includes a low-resistance n-type GaN substrate 21, a semiconductor layered structure 300 provided on the substrate 21, and a pair of electrodes 10 and 11 for supplying a current required for light emission. The mount surface of the semiconductor laser device 3000 is on the side of the electrode 11.

Hereinafter, a structure of the semiconductor layered structure 300 will be described in detail. The semiconductor layered structure 300 includes, in the following order on the low-resistance n-type GaN substrate 21, the n-type GaN buffer layer 2 (thickness: about 0.9 µm), an n-type $In_{0.34}Ga_{0.66}N$ light absorption layer 36 (thickness: about 0.1 µm), the n-type $Al_{0.1}Ga_{0.9}N$ cladding layer 3 (thickness: about 0.9 µm), the non-doped $In_{0.30}Ga_{0.70}N$ active layer 34 (thickness: about 150 Å), the p-type $Al_{0.1}Ga_{0.9}N$ cladding layer 5 (thickness: about 0.9 µm), a p-type $In_{0.34}Ga_{0.66}N$ light absorption layer 37 (thickness: about 0.1 µm), and the p-type GaN contact layer 9 (thickness: about 0.9 µm). The p-type $In_{0.34}Ga_{0.66}N$ light absorption layer 37 includes a stripe-shaped opening 38 extending along the cavity length direction.

The p-electrode 10 is provided on the upper surface of the p-type GaN contact layer 9, and the n-electrode 11 is provided on the bottom surface of the substrate. The p-electrode 10 is an opaque electrode and is located so as to completely block a light path which is travelling thereto from the light emitting section through the stripe-shaped opening 38 and the p-type GaN contact layer 9.

When a voltage is applied from a current supply circuit (not shown) across the electrodes 10 and 11, the current flows through the semiconductor layered structure 300 from the p-electrode 10 to the n-electrode 11. The p-type $In_{0.34}Ga_{0.66}N$ light absorption layer 37 sandwiched between the p-type $Al_{0.1}Ga_{0.9}N$ cladding layer 5 and the p-type GaN contact layer 9 has a bandgap smaller than that of the active layer 34, and thus inhibits the injection of the holes into the active layer 34. However, when the stripe-shaped opening 38 is provided in the p-type $In_{0.34}Ga_{0.66}N$ light absorption layer 37, as in the present example, the holes are selectively injected into the active layer 34 through the opening 38, whereby light is generated in a portion of the active layer 34 directly under the opening 38.

The generated light partially seeps into the cladding layers 3 and 5. However, since the p-type $In_{0.34}Ga_{0.66}N$ light absorption layer 37 and the n-type $In_{0.34}Ga_{0.66}N$ light absorption layer 36 are provided, respectively, on the upper and lower side of the active layer 34, the light seeping into either of the cladding layers 3 and 5 is either absorbed by one of the light absorption layers 36 and 37 or blocked by the p-type electrode 10 after passing through the opening 38 of the p-type $In_{0.34}Ga_{0.66}N$ light absorption layer 37. Therefore, in either case, even if a photodiode is provided in the same package with this gallium nitride-type compound semiconductor laser 3000, such light is never incident upon the photodiode as noise to cause an erroneous control.

Hereinafter, referring to FIGS. 6A to 6F, a method for producing the semiconductor laser device 3000 of FIG. 3 will be described.

Figure 6A:
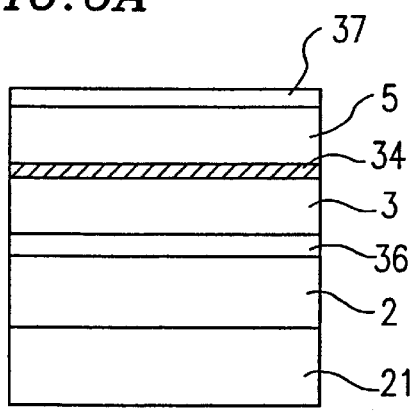
FIGS. 6A to 6F are cross-sectional views illustrating a method for producing the nitride-type compound semiconductor light emitting device of FIG. 3.

For performing the first crystal growth using the same MOCVD method as in Example 1, the low-resistance n-type GaN substrate 21 is placed on a susceptor in an MOCVD apparatus (not shown). After the substrate 21 is heated to about 1000° C., the n-type GaN buffer layer 2 is grown on the n-type GaN substrate 21. Thereafter, the substrate 21 is cooled down to between about 800° C. to about 850° C., and the n-type $In_{0.34}Ga_{0.66}N$ light absorption layer 36 is grown. Then, the substrate 21 is heated again to about 1000° C., and the n-type $Al_{0.1}Ga_{0.9}N$ cladding layer 3 is grown. Thereafter, the substrate 21 is again cooled down to between about 800° C. to about 850° C., and the non-doped $In_{0.30}Ga_{0.70}N$ active layer 34 is grown. Then, the substrate 21 is again heated to about 1000° C., and the Mg-doped $Al_{0.1}Ga_{0.9}N$ cladding layer 5 is grown. Thereafter, the substrate 21 is again cooled down to between about 800° C. to about 850° C., and the Mg-doped $In_{0.34}Ga_{0.66}N$ light absorption layer 37 is grown. Thus, the structure as illustrated in FIG. 6A is obtained.

Figure 6D:
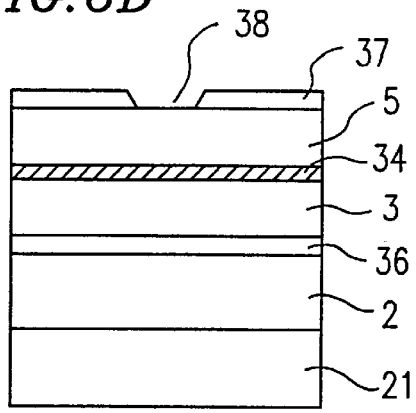
Figure 6B:
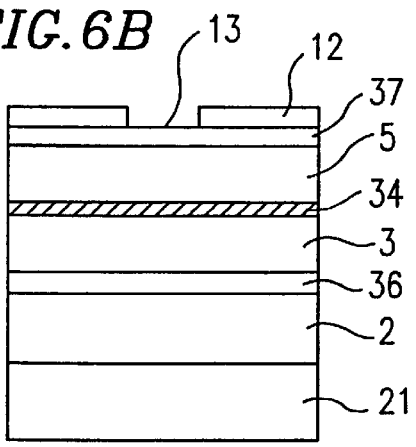

The substrate 21, on which the above-described semiconductor layers are formed, is once taken out of the growth chamber, and the mask 12 as illustrated in FIG. 6B is formed on the Mg-doped $In_{0.34}Ga_{0.66}N$ light absorption layer 37 by using an ordinary photolithography technique. The mask 12 may be formed from a resist, or from $SiO_x$, $SiN_x$ (where x is an integer of about 1 or 2) or Ni. The mask 12 includes a stripe-shaped opening 13.

Figure 6E:
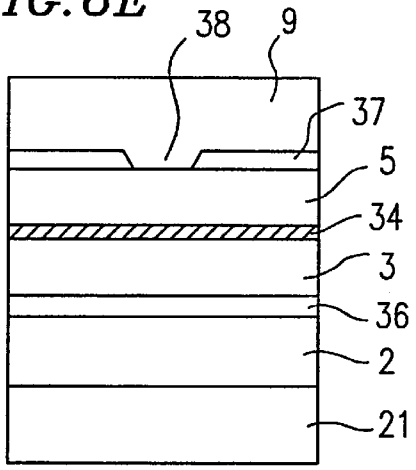
Figure 6C:
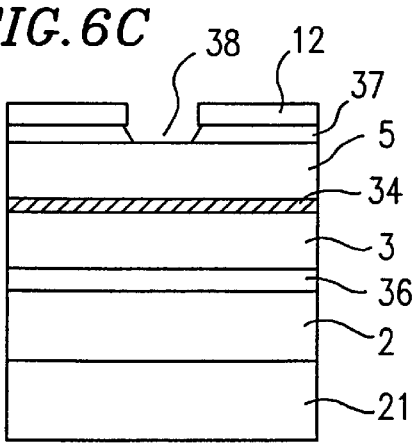

Then, a portion of the Mg-doped $In_{0.34}Ga_{0.66}N$ light absorption layer 37 which is not covered by the mask 12 is selectively etched away by using a dry etching technique, as illustrated in FIG. 6C. The etching process is stopped at a time when the surface of the Mg-doped $Al_{0.1}Ga_{0.9}N$ cladding layer 5 is exposed. The etching process can be performed by, for example, RIE using a gas such as a $Cl_2$ gas. Thereafter, the mask 12 is removed by using an appropriate etchant (e.g., an organic solvent when the mask 12 is a photoresist) as illustrated in FIG. 6D.

Figure 6F:
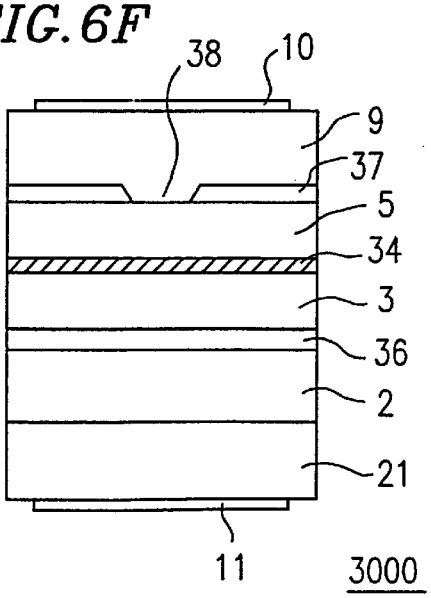
Figure 10:
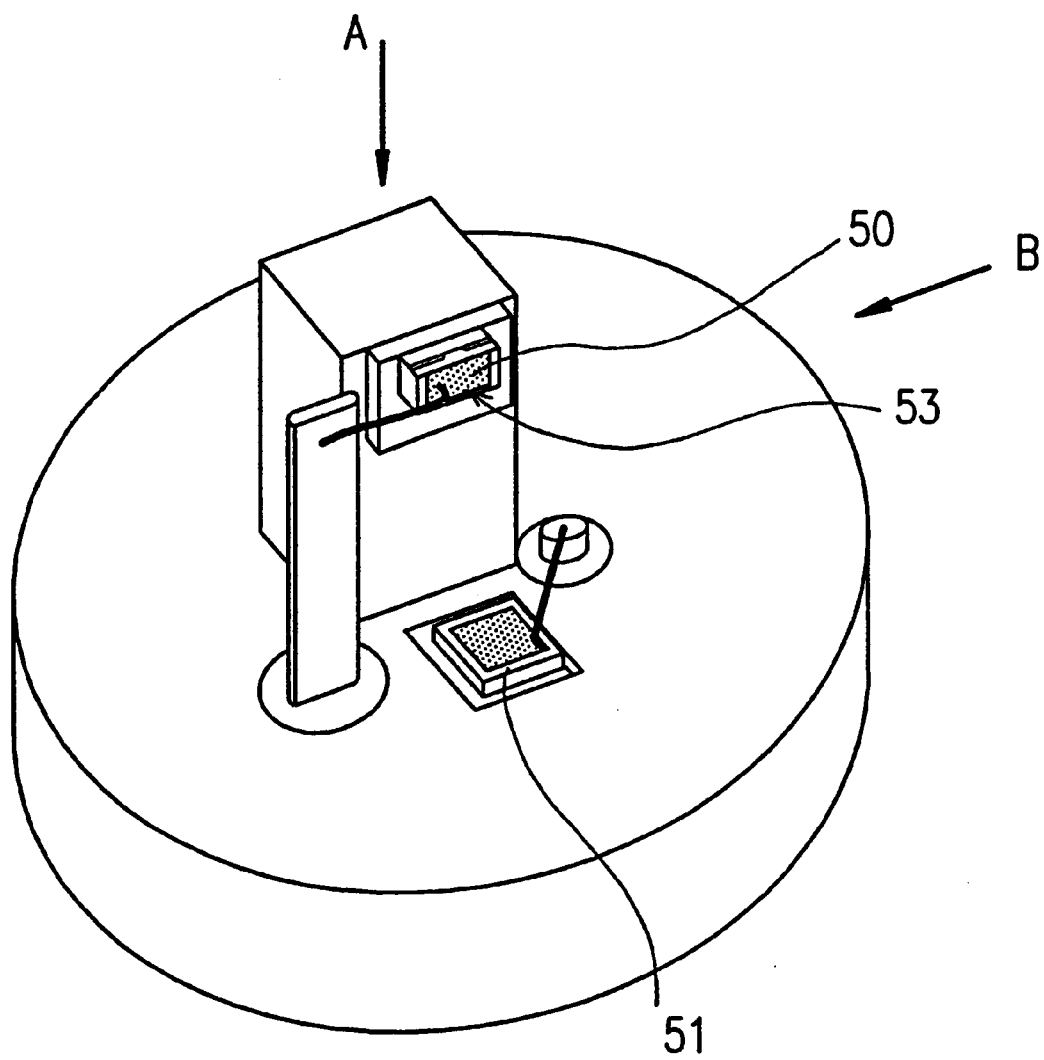
FIG. 10 is a perspective view illustrating the conventional nitride-type compound semiconductor laser of FIG. 9 as it is incorporated into a package.

Then, for performing the second crystal growth (regrowth), the substrate 21 is again placed on the susceptor in the MOCVD apparatus. After the substrate 21 is heated to about 1000° C., the p-type GaN contact layer 9 is grown, as illustrated in FIG. 6E. Thereafter, the substrate 21 is again taken out of the MOCVD apparatus and is subjected to a thermal annealing process in an $N_2$ atmosphere at about 800° C. so as to change the Mg-doped layers into p-type layers. Then, the p-electrode 10 is formed on the p-type GaN contact layer 9, and the n-electrode 11 is formed on the bottom surface of the low-resistance n-type GaN substrate 21, as illustrated in FIG. 6F.

Although the thickness of the n-type GaN buffer layer 2 is about 0.9 µm in the present example, it can also take any other value in the range of about 0.5 µm to about 4 µm. When the buffer layer 2 is thinner than about 0.5 µm, it is likely that crystal defects of the substrate 21 will be transferred to the layered structure on this n-type GaN buffer layer 2. On the other hand, when the buffer layer 2 is thicker than about 4 µm, a resistance component of this n-type GaN buffer layer 2 itself may increase to a non-negligible level.

Moreover, although the thickness of each of the cladding layers (the n-type $Al_{0.1}Ga_{0.9}N$ cladding layer 3 and the Mg-doped $Al_{0.1}Ga_{0.9}N$ cladding layer 5) is about 0.9 µm in the present example, it can also take any other value in the range of about 0.7 µm to about 1 µm. When the cladding layers 3 and 5 are thinner than about 0.7 µm, the light generated in the active layer 34 may not be confined sufficiently. On the other hand, when the cladding layers 3 and 5 are thicker than about 1 µm, it is very likely that a crack will occur in the $Al_{0.1}Ga_{0.9}N$ cladding layers 3 and 5.

Furthermore, although the thickness of each of the light absorption layers (the n-type $In_{0.34}Ga_{0.66}N$ light absorption layer 36 and the p-type $In_{0.34}Ga_{0.66}N$ light absorption layer 37) is about 0.1 µm in the present example, it can also take any other value in the range of about 0.05 µm to about 0.5 µm. When the light absorption layers 36 and 37 are thinner than about 0.05 µm, the light absorption effect may not be sufficient. On the other hand, when the light absorption layers 36 and 37 are thicker than about 0.5 μm, the injection efficiency of the holes into the active layer 34 may be lowered to an unacceptable level.

Furthermore, although the thickness of the non-doped $In_{0.30}Ga_{0.70}N$ active layer 34 is about 150 Å in the present example, it can also take any other value in the range of about 30 Å to about 800 Å. When the active layer 34 is thinner than about 30 Å, light confinement may not be sufficient. On the other hand, when the active layer 34 is thicker than about 800 Å, a threshold current density may increase.

Furthermore, although the thickness of the p-type GaN contact layer 9 is about 0.9 μm in the present example, it can also take any other value in the range of about 0.1 μm to about 1 μm. When the contact layer 9 is thinner than about 0.1 μm, a contact resistance between the contact layer 9 and the p-electrode 10 may not be reduced sufficiently. On the other hand, when the contact layer 9 is thicker than about 1 μm, a resistance component of this p-type GaN contact layer 9 itself may increase to a non-negligible level.

EXAMPLE 4

In Example 3 above, the light absorption layers 36 and 37 are provided on both sides of the active layer 34. In some cases, the light absorption layer on the side of the mount surface may also be provided with an opening, as in Example 4 below.

Figure 4:
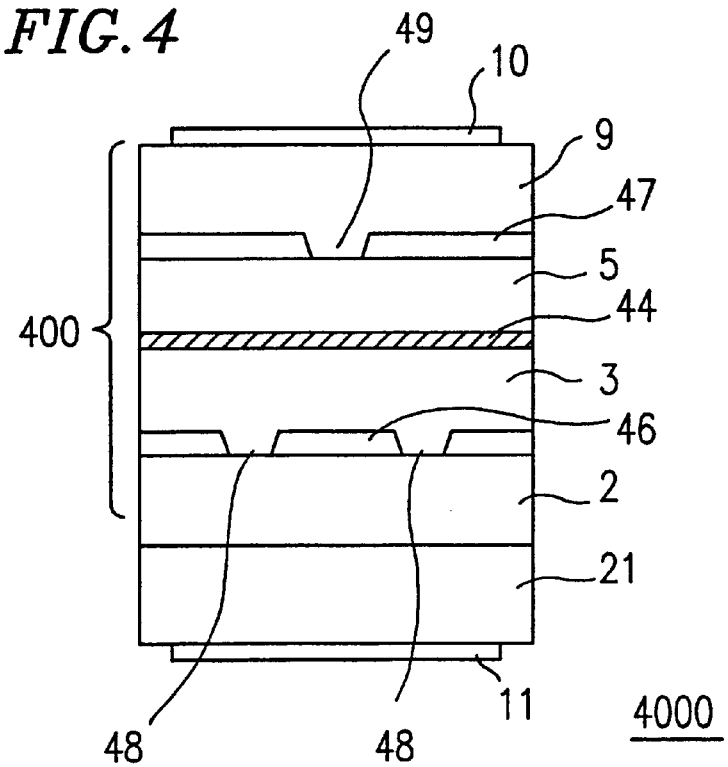
FIG. 4 is a cross-sectional view schematically illustrating a structure of a nitride-type compound semiconductor light emitting device according to Example 4 of the present example.

Referring to FIG. 4, a gallium nitride-type compound semiconductor laser device 4000 according to Example 4 of the present invention will be described.

As illustrated in FIG. 4, the semiconductor laser device 4000 of the present example includes a low-resistance n-type GaN substrate 21, a semiconductor layered structure 400 provided on the substrate 21, and a pair of electrodes 10 and 11 for supplying a current required for light emission. The mount surface of the semiconductor laser device 4000 is on the side of the electrode 11.

Hereinafter, a structure of the semiconductor layered structure 400 will be described in detail.

The semiconductor layered structure 400 includes, in this order on the low-resistance n-type GaN substrate 21, the n-type GaN buffer layer 2 (thickness: about 1.0 μm), an n-type $Ga_{0.615}Al_{0.038}In_{0.347}N$ light absorption layer 46 (thickness: about 0.2 μm), the n-type $Al_{0.1}Ga_{0.9}N$ cladding layer 3 (thickness: about 1 μm), a non-doped $In_{0.29}Ga_{0.71}N$ active layer 44 (thickness: about 250 Å), the p-type $Al_{0.1}Ga_{0.9}N$ cladding layer 5 (thickness: about 1 μm), a p-type $Ga_{0.615}Al_{0.038}In_{0.347}N$ light absorption layer 47 (thickness: about 0.2 μm), and the p-type GaN contact layer 9 (thickness: about 1.0 μm).

The p-type $Ga_{0.615}Al_{0.038}In_{0.347}N$ light absorption layer 47 and the n-type $Ga_{0.615}Al_{0.038}In_{0.347}N$ light absorption layer 46 include one or more stripe-shaped openings 48 and 49, respectively, extending along the cavity length direction.

The p-electrode 10 is provided on the upper surface of the p-type GaN contact layer 9, and the n-electrode 11 is provided on the bottom surface of the substrate. The p-electrode 10 is an opaque electrode and is located so as to completely block a light path which is travelling thereto from the light emitting section through the stripe-shaped opening 49 provided in the p-type $Ga_{0.615}Al_{0.038}In_{0.347}N$ light absorption layer 47 and the p-type GaN contact layer 9. On the other hand, stripe-shaped openings 48 in the n-type GaAlInN light absorption layer 46 are arranged so as to completely block (by the rest of the n-type GaAlInN light absorption layer 46) the light which travels from the light emitting section through the stripe-shaped openings 48, the n-type GaN buffer layer 2 and the n-type GaN substrate 21 and is reflected at the mount surface so as to pass through the n-type GaN substrate 21 and the n-type GaN buffer layer 2, and back to the n-type $Ga_{0.615}Al_{0.038}In_{0.347}N$ light absorption layer 46.

When a voltage is applied from a current supply circuit (not shown) across the electrodes 10 and 11, the current flows through the semiconductor layered structure 400 from the p-electrode 10 to the n-electrode 11. The p-type $Ga_{0.615}Al_{0.038}In_{0.347}N$ light absorption layer 47 sandwiched between the p-type $Al_{0.1}Ga_{0.9}N$ cladding layer 5 and the p-type GaN contact layer 9 has a bandgap smaller than that of the active layer 44, and thus inhibits the injection of the holes into the active layer 44. However, when the stripe-shaped opening 49 is provided in the p-type $Ga_{0.615}Al_{0.038}In_{0.347}N$ light absorption layer 47, as in the present example, the holes are injected into the active layer 44 through the opening 49. Similarly, the n-type $Ga_{0.615}Al_{0.038}In_{0.347}N$ light absorption layer 46 sandwiched between the n-type GaN buffer layer 2 and the n-type $Al_{0.1}Ga_{0.9}N$ cladding layer 3 has a bandgap smaller than that of the active layer 44, and thus inhibits the injection of electrons into the active layer 44. However, when the stripe-shaped openings 48 are provided in the n-type $Ga_{0.615}Al_{0.038}In_{0.347}N$ light absorption layer 46, as in the present example, the electrons are injected into the active layer through the opening 48.

The emitted light partially seeps into the upper and/or lower cladding layers 3 and 5. However, since the p-type $Ga_{0.615}Al_{0.038}In_{0.347}N$ light absorption layer 47 and the n-type $Ga_{0.615}Al_{0.038}In_{0.347}N$ light absorption layer 46 are provided, respectively, on the upper and lower side of the active layer 44, the light seeping into either of the cladding layers 3 and 5 is absorbed by one of the light absorption layers 46 and 47 either directly or after being reflected by the mount surface or, otherwise, is blocked by the p-electrode 10. Therefore, in either case, even if a photodiode is provided in the same package with this gallium nitride-type compound semiconductor laser 4000, such light is never incident upon the photodiode as noise to cause an erroneous control.

Hereinafter, referring to FIGS. 7A to 7H, a method for producing the semiconductor laser device 4000 of FIG. 4 will be described.

For performing the first crystal growth using the same MOCVD method as in Example 1, the low-resistance n-type type GaN substrate 21 is placed on a susceptor in an MOCVD apparatus (not shown). After the substrate 21 is heated to about 1000° C., the n-type GaN buffer layer 2 is grown on the n-type GaN substrate 21. Thereafter, the substrate is cooled down to between about 800° C. to about 850° C., and the n-type $Ga_{0.615}Al_{0.038}In_{0.347}N$ light absorption layer 46 is grown. Thus, the structure as illustrated in FIG. 7A is obtained.

The substrate 21, on which the above-described semiconductor layers are formed, is once taken out of the growth chamber, and the $SiO_x$ mask 12 (where x is an integer of about 1 or 2) as illustrated in FIG. 7B is formed on the n-type $Ga_{0.615}Al_{0.038}In_{0.347}N$ light absorption layer 46 by using an ordinary photolithography technique (and an etching technique). As illustrated in the figure, the mask 12 is formed in stripes. Then, portions of the n-type $Ga_{0.615}Al_{0.038}In_{0.347}N$ light absorption layer 46 which are not covered by the mask 12 are selectively etched away to obtain the openings 48 by using a dry etching technique, as illustrated in FIG. 7C. The etching process is stopped at a time when the portions of the n-type $Ga_{0.615}Al_{0.038}In_{0.347}N$ light absorption layer 46 are removed and the n-type GaN buffer layer 2 is exposed. The etching process can be performed by, for example, RIE using a gas such as a $Cl_2$ gas. Thereafter, the mask 12 is removed by using an appropriate etchant (e.g., an organic solvent when the mask 12 is a photoresist) as illustrated in FIG. 7D.

Then, for performing the second crystal growth (regrowth), the, substrate 21 is again placed on the susceptor in the MOCVD apparatus. After the substrate 21 is heated to about 1000° C., n-type $Al_{0.1}Ga_{0.9}N$ cladding layer 3 is grown. Thereafter, the substrate 21 is again cooled down to between about 800° C. to about 850° C., and the non-doped $In_{0.29}Ga_{0.71}N$ active layer 44 is grown. After the substrate 21 is again heated to about 1000° C., the Mg-doped $Al_{0.1}Ga_{0.9}N$ cladding layer 5 is grown. Then, the substrate 21 is again cooled down to between about 800° C. to about 850° C., and the p-type $Ga_{0.615}Al_{0.038}In_{0.347}N$ light absorption layer 47 is grown. Thus, the structure as illustrated in FIG. 7E is obtained.

The substrate 21, on which the above-described semiconductor layers are formed, is again taken out of the growth chamber. Then, the ordinary photolithography technique and the etching technique, used for providing the openings 48 in the n-type $Ga_{0.615}Al_{0.038}In_{0.347}N$ light absorption layer 46 are used again so as to provide an opening 49 in the Mg-doped $Ga_{0.615}Al_{0.038}In_{0.347}N$ light absorption layer 47, as illustrated in FIG. 7F.

Then, for performing the third crystal growth (regrowth), the substrate 21 is again placed on the susceptor in the MOCVD apparatus. After the substrate 21 is heated to about 1000° C., the Mg-doped GaN contact layer 9 is grown, as illustrated in FIG. 7G. Thereafter, the substrate 21 is taken out of the MOCVD apparatus, and is subjected to a thermal annealing process in an $N_2$ atmosphere at about 800° C. so as to change the Mg-doped layers into p-type layers. Then, the p-electrode 10 is formed on the p-type GaN contact layer 9, and the n-electrode 11 is formed on the bottom surface of the low-resistance n-type GaN substrate 21.

The layers described in the present example do not have to have the respective thicknesses as specified above, but can also have any other thicknesses within the respective ranges specified above in Example 3.

Although GaAlInN is used for the light absorption layer in Examples 1 to 4, an n-type III-V group semiconductor such as GaInAsp or AlGaInAs, an n-type II-VI group semiconductor such as CdZeSSe, or Si or Ge may alternatively be used as long as it has a bandgap smaller than that of the active layer.

Although the light absorption layers 17, 37, 46, and 47 used in Examples 1, 3 and 4 has the same conductivity type as that of the adjacent layers, each of the light absorption layers 37, 46, and 47 used in Examples 3 and 4 including the opening 38, 48, 49 may alternatively have the opposite conductivity type.

The light absorption layer may be located at any position such that the light leaked from the cladding layers is reliably absorbed so as not to leak out of the device. Thus, the location of the light absorption layer is not limited to those illustrated in the examples.

The material used for the substrate of the gallium nitride-type compound semiconductor laser device of the present invention is not limited to those described above. For example, sapphire, ZnO, GaN, $MgAl_2O_4$, GaAs, $LiAlO_2$, $LiGaO_2$, or the like, may be used instead of 6H-SiC or GaN.

Although, the metal-organic chemical vapor deposition (MOCVD) method is used for forming the layered structure in the above examples, other atomic control growth methods such as an MBE method and an HVPE method may alternatively be used.

As described above the present invention provides: a nitride-type compound semiconductor laser device without light leakage, which may cause an erroneous control of a photodiode provided in the same package with the gallium nitride-type compound semiconductor laser device; a laser apparatus in which the above-mentioned nitride-type compound semiconductor laser device and a light receiving device are provided in the same package; and a circuit for photoelectrically converting an output of the above-mentioned nitride-type compound semiconductor laser device by the light receiving device and for controlling a current to be input to the gallium nitride-type compound semiconductor laser device based on the photoelectrically converted output.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nitride-type semiconductor laser device, comprising a substrate and a layered structure provided on the substrate, wherein:

a light absorption layer having a bandgap smaller than a bandgap of an active layer in the layered structure is provided in a position between a cladding layer, which is provided on a side opposite to a mount surface with respect to the active layer, and a surface of the layered structure which is positioned on a side opposite to the mount surface;

an opaque electrode is provided on the surface of the layered structure which is positioned on a side opposed to the mount surface, and a light path which is travelling from the active layer to the surface which is positioned on a side opposite to the mount surface of the layered structure is arranged so as to be either completely absorbed by the light absorption layer or blocked by the opaque electrode, the semiconductor laser device further comprising another light absorption layer having a bandgap smaller than the bandgap of the active layer, which is provided on the same side as the mount surface with respect to the active layer, wherein the light absorption layers each having an opening are provided at both sides of the active layer.

2. A nitride-type semiconductor laser device comprising a substrate and a layered structure provided on the substrate, wherein:

a first light absorption layer having a bandgap smaller than a bandgap of an active layer in the layered structure is provided in a position between a cladding layer, which is provided on a side opposite to a mount surface with respect to the active layer, and a surface of the layered structure which is positioned on a side opposite to the mount surface, a second light absorption layer having a bandgap smaller than the bandgap of the active layer is provided on the same side as the mount surface with respect to the active layer, an opaque electrode is provided on the surface of the layered structure which is positioned on a side opposite to the mount surface, and a light path which is travelling from the active layer to the surface which is positioned on a side opposite to the mount surface of the layered structure is arranged so as to be either completely absorbed by the first light absorption layer or blocked by the opaque electrode, wherein the first light absorption layer has the same conductivity type as that of the adjacent layers, and wherein either the first light absorption layer or the second light absorption layer includes at least one stripe-shaped opening and is provided at the side of the active layer.

3. A nitride-type semiconductor laser device according to claim 2, wherein both the first light absorption layer and the second light absorption layer include at least one stripe-shaped opening.

4. A laser apparatus comprising a nitride-type compound semiconductor laser device according to claim 2 and a light receiving device provided a same package.

* * * * *